(12) United States Patent
Takai et al.

(10) Patent No.: US 6,424,231 B2
(45) Date of Patent: *Jul. 23, 2002

(54) VOLTAGE CONTROLLED OSCILLATION CIRCUIT

(75) Inventors: Kiyofumi Takai, Omihachiman; Koji Ryugo, Shiga-ken, both of (JP)

(73) Assignee: Murata Manufacturing Co., Ltd., Nagaokakyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/338,383

(22) Filed: Jun. 23, 1999

(30) Foreign Application Priority Data

Jun. 29, 1998 (JP) .............................. 10-182524

(51) Int. Cl.[7] .................................. H03B 5/00

(52) U.S. Cl. ............. 331/117 R; 331/167; 331/107 SL; 331/177 V

(58) Field of Search ...................... 331/107 SL, 107 DP, 331/117 R, 177 V, 108 C, 167, 117 FE, 36 C

(56) References Cited

U.S. PATENT DOCUMENTS

| | | | | |
|---|---|---|---|---|
| 5,508,665 A | * | 4/1996 | Chan et al. | 331/117 D |
| 5,559,479 A | * | 9/1996 | Ohmori et al. | 331/177 V |
| 5,600,279 A | * | 2/1997 | Mori | 331/36 C |
| 5,999,061 A | * | 12/1999 | Pope et al. | 331/49 |

* cited by examiner

*Primary Examiner*—Arnold Kinkead
(74) *Attorney, Agent, or Firm*—Burns, Doane, Swecker & Mathis, LLP

(57) ABSTRACT

It is an object of the present invention to provide the voltage controlled oscillation circuit preventing the influence of a capacitor in the output side of the loop filter connected to a control voltage terminal. A voltage controlled oscillation circuit comprising of an amplifier circuit, a resonance circuit, a varactor diode, a choke element whose one end is connected to the cathode of a varactor diode, a capacitor connected between the other end of the choke element and a ground, and a resistor connected between the other end of the choke element and a control voltage terminal. A sub-resonance of the resonance system of the voltage controlled oscillation circuit due to the capacitor in the output side of the loop filter connected to the control voltage terminal can be eliminated, the abnormal oscillation of the voltage controlled oscillation circuit can be prevented, and the relationship between the oscillation frequency and the control voltage exhibits almost linear.

6 Claims, 4 Drawing Sheets

VOLTAGE CONTROLLED OSCILLATION CIRCUIT

Priority is claimed to Japanese Patent Application No. 10-182524 filed in Japan on Jun. 29, 1998, the entire contents of which is hereby incorporated by reference.

BACKGROUND OF THE INVENTION

1. Field of the Invention

This invention relates to a voltage controlled oscillation circuit, and particularly relates to a voltage controlled oscillation circuit used for mobile communication apparatuses, such as a portable telephone.

2. Description of the Related Art

With a size-reduction of mobile-communication apparatuses, such as portable telephones, the demand of a size-reduction of RF circuits including circuits such as voltage-controlled oscillation circuits and PLL circuits has become strong in recent years.

The circuit diagram of a conventional voltage controlled oscillation circuit is shown in FIG. 6. The voltage controlled oscillation circuit 1 comprises an amplifier circuit 2, a resonance circuit 3, three capacitors C1, C2 and C3, a varactor diode D1, and a choke element L1. The amplifier circuit 2 is connected to the resonance circuit 3, and the varactor diode D1 is connected in parallel to the resonance circuit 3 via a first capacitor C1. One end of the choke element L1 is connected to the cathode of the varactor diode D1, and the other end of the choke element L1 is connected to the ground via a third capacitor C3. Moreover, a second capacitor C2 is connected in parallel to the choke element L1. The output of the amplifier circuit 2 is connected to an output terminal 4, and the other end of the choke element L1 is connected to a control voltage terminal 5.

The control voltage terminal 5 is a terminal for changing the oscillation frequency of the voltage controlled oscillation circuit 1. A DC voltage is applied to the varactor diode D1, the internal capacitance of the varactor diode D1 is changed. The changes of the internal capacitance brings the changes of the resonance frequency of the resonance system including the resonance circuit 3, the varactor diode D1 or the like. As a result, the oscillation frequency of the voltage controlled oscillation circuit 1 varies accordingly. Moreover, the choke element L1 is an inductor provided such that the load connected to the control voltage terminal 5 might not influence the resonance circuit 3. For example, the choke element L1 comprises of a microstrip line having a predetermined length and a narrow width. The third capacitor C3 is a bypass capacitor. The second capacitor 2 is provided such that the second capacitor 2 is caused to be resonated with the choke element L1 in the vicinity of the oscillation frequency and the impedance between the cathode of the varactor diode D1 and the control voltage terminal 5 in an oscillation frequency is made as high as possible. In this way the second capacitor 2 compensates the characteristics, as the choke element L1 does not necessarily work as an ideal choke element.

Usually, the control voltage terminal 5 of the voltage controlled oscillation circuit is connected to a loop filter when PLL circuit is formed. In FIG. 6, a loop filter 6 is shown. A resistor R1 and a fourth capacitor C4 are included in the output side of the loop filter 6. When the loop filter 6 is connected to the control voltage terminal 5 of the voltage controlled oscillation circuit 1, the resistor R1 built in the loop filter 6 is connected in series to the control voltage terminal 5 of the voltage controlled oscillation circuit 1. Moreover, the fourth capacitor C4 is connected in parallel to the third capacitor C3 of the voltage controlled oscillation circuit 1.

When a demand for a size-reduction of RF circuit was not excessively strong, the voltage controlled oscillation circuit 1 and the loop filter 6 were able to be arranged with a wider distance between them. In this case, siring is formed, for example, on a mounting substrate from the output of the loop filter 6 to the control voltage terminal 5 of the voltage controlled oscillation circuit 1, and this wiring works as an inductance in the high frequency corresponding to the oscillation frequency of the voltage controlled oscillation circuit 1. Thus, the fourth capacitor C4 in the output side of the loop filter 6 did not necessarily affect the characteristic of the voltage controlled oscillation circuit 1.

However, when demand for a size-reduction of RF circuit becomes strong and the distance of the voltage controlled oscillation circuit 1 and the loop filter 6 becomes small, the inductance component of the wiring between them is almost eliminated, and the fourth capacitor C4 in the output side of the loop filter 6 comes to be connected in parallel to the third capacitor C3 of the voltage controlled oscillation circuit 1.

At this time, a sub-resonance (i.e., a secondary resonance as a by-product) occurs in the resonance circuit of the voltage controlled oscillation circuit 1 by that the fourth capacitor C4 is connected in parallel to the third capacitor C3. Particularly in order to improve a lock-up time, when the capacitance of the fourth capacitor C4 in the output side of the loop filter 6 is made small, the frequency of the sub-resonance is generated in the vicinity of the original oscillation frequency of the voltage controlled oscillation circuit 1. Conversely, when the distance of the voltage controlled oscillation circuit 1 and the loop filter 6 is made large, it means that the frequency of the sub-resonance is located far away from the original oscillation frequency since the inductance component of the wiring between the voltage controlled oscillation circuit 1 and the loop filter 6 is large.

In FIG. 7, the impedance of a resonance circuit 3 side ( mag (Z11), abbreviation of magnitude (Z11), logarithmic representation of the absolute value of Z11) is shown. The resonance circuit 3 side is viewed from the node of the amplifier circuit 2 of the voltage controlled oscillation circuit 1, and the resonance circuit 3 side includes all of the varactor diode D1, the capacitor C4 or the like.

As shown in FIG. 7, though the pole of the impedance (resonance point) is in the original oscillation frequency f1, another pole of the impedance (sub-resonance point) exists also in the frequency f2 which is a little lower than the frequency f1. Due to this sub-resonance point, when the oscillation frequency of the voltage controlled oscillator 1 is changed, there is a problem that an abnormal oscillation depending on conditions occurs.

In FIG. 8, the relationship of a control voltage (DC voltage applied to the control voltage terminal 5) and an oscillation frequency is shown when the fourth capacitor C4 is connected in parallel to the control voltage terminal 5 of the voltage controlled oscillation circuit 1. As is clear from FIG. 8, the abnormal oscillation occurs when the control voltage exceeded 2.6V, and a normal oscillation stops. When the control voltage is 2.8V, the oscillation resumes at the different frequency far away from the oscillation frequency whet the control voltage is 2.6V or less. When the control voltage is 2.6V or less, the oscillation frequency is a range from approximately 700 MHZ to 740 MHZ, on the other hand, when the control voltage is 2.8V, the oscillation frequency is approximately 820 MHZ. Moreover, changes of the oscillation frequency to changes of the control voltage also becomes small.

SUMMARY OF THE INVENTION

It is an object of the present invention to solve the above-described problems, and to provide the voltage controlled oscillation circuit preventing the influence due to the capacitor in the output side of the loop filter connected to a control voltage terminal.

In order to achieve the above-mentioned object, the present invention is to provide a voltage controlled oscillation circuit including an amplifier circuit, a resonance circuit connected to the amplifier circuit, a varactor ode connected to the resonance circuit, one end of a choke element connected to the cathode of the varactor diode, a capacitor connected between the other end of the choke element and a ground, and an inductance element or a resistive element connected to the other end of the choke element.

Due to the above configuration, the voltage controlled oscillation circuit of the present invention is not affected by the capacitor in the output side of the loop filter connected to the control voltage terminal.

BRIEF DESCRIPTION OF THE DRAWINGS

The present invention will now be described by way of exemplary embodiments, to which it is not limited, as illustrated in the accompanying drawings.

DESCRIPTION OF THE PREFERRED EMBODIMENT

Figure 1:
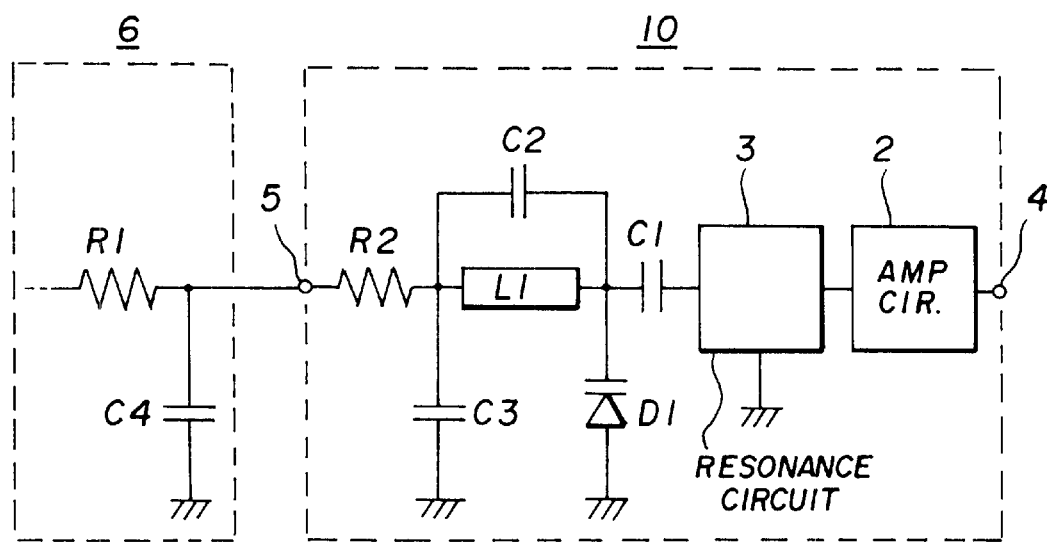
FIG. 1 is the circuit diagram showing a preferred embodiment of a voltage controlled oscillation circuit of the present invention.
Figure 6:
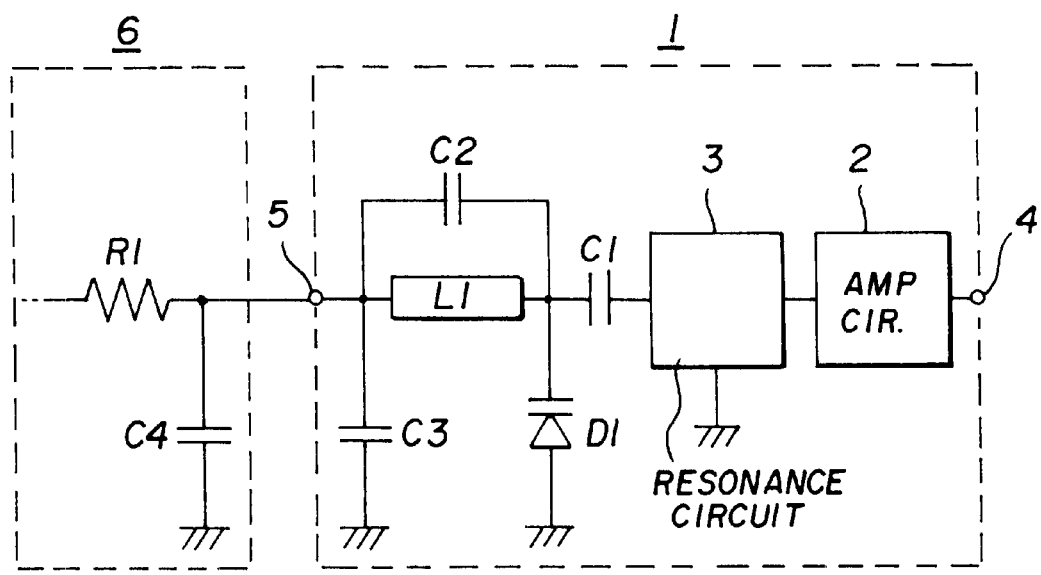
FIG. 6 is the circuit diagram showing a conventional voltage controlled oscillation circuit.
Figure 7:
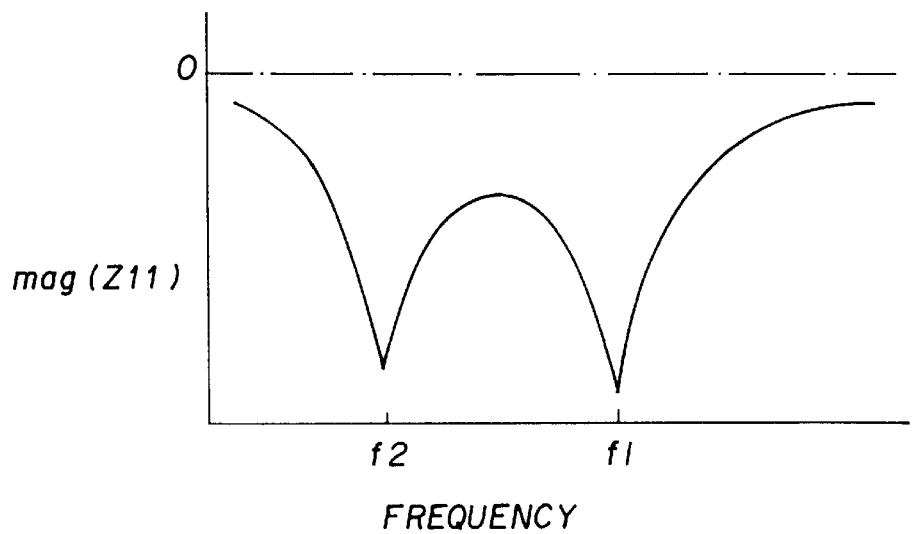
FIG. 7 is the diagram showing the impedance as which the resonance circuit side is viewed from the node of the amplifier circuit and the resonance circuit of the voltage controlled oscillation circuit of FIG. 6.
Figure 8:
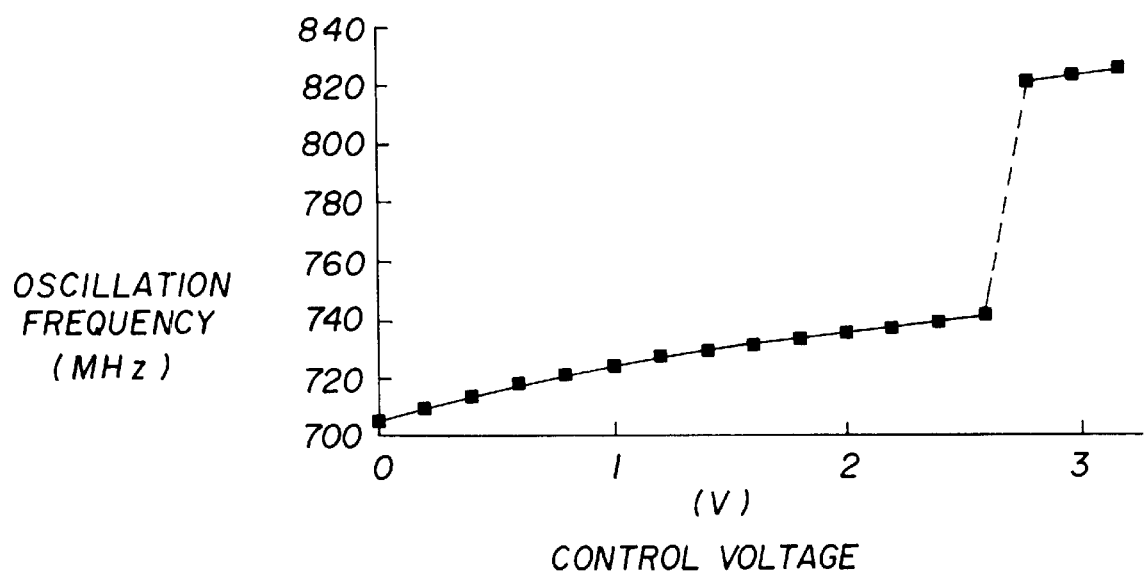
FIG. 8 is the diagram showing the relationship between the oscillation frequency and the control voltage in the voltage controlled oscillation circuit of FIG. 6.

A preferred embodiment of the voltage controlled oscillation circuit of the present invention is shown in FIG. 1. In FIG. 1, the same symbol or reference numeral used in FIG. 6 shows an identical or equivalent portion and the explanation corresponding to it is omitted.

In the voltage controlled oscillation circuit 10 shown in FIG. 1, a resistor R2 as resistive element is connected between the other end of the choke element L1 and the control voltage terminal 5. In this case, the resistor, R2 is a chip resistor.

In such a configuration, the fourth capacitor C4 of the loop filter 6 is connected to the third capacitor C3 of the voltage controlled oscillation circuit 10 via at least the resistor R2. Therefore, in a high-frequency manner the fourth capacitor C4 can be regarded as a capacitor having a very large mount of an internal loss. Quality factor Q in the frequency f2 of the sub-resonance degrades greatly, and resonance hardly happens in the frequency f2 of the sub-resonance. That is, the sub-resonance does not occur.

Figure 2:
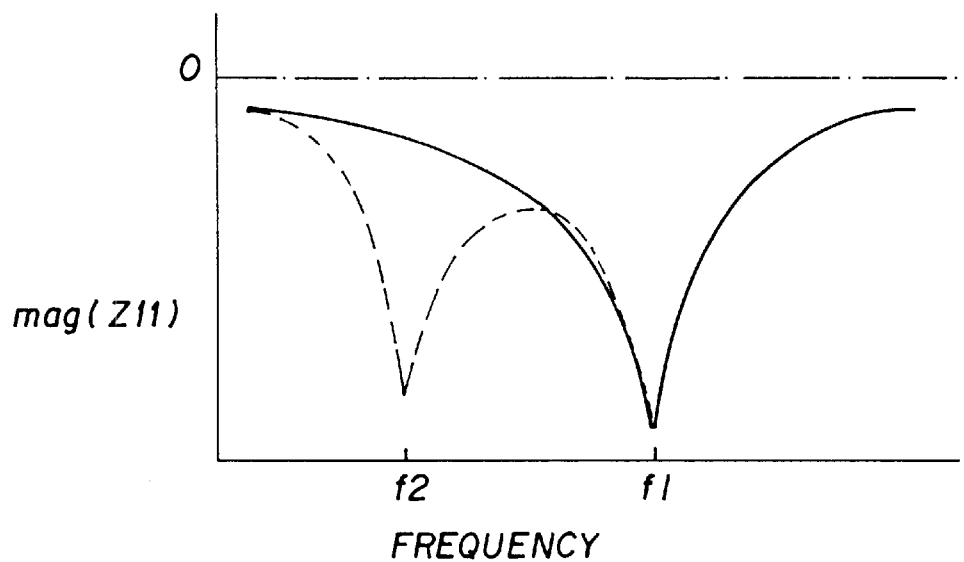
FIG. 2 is the diagram showing an impedance as which a resonance circuit side is viewed from the node of an amplifier circuit and a resonance circuit of the voltage controlled oscillation circuit of FIG. 1.

In FIG. 2, the impedance (mag (Z11)) of the resonance circuit 3 side is shown. The resonance circuit 3 side is viewed from the node of the resonance circuit 3 and the amplifier circuit 2 of the voltage controlled oscillation circuit 1 when the resistor R2 is connected between the other end of the choke element L1 and the control voltage terminal 5. The broken line shows the characteristic of the conventional voltage controlled oscillation circuit 1, and the solid line shows the characteristic of the voltage controlled oscillation circuit 10 of the present invention. As shown in FIG. 2, in the voltage controlled oscillation circuit 10 of the invention, the sub-resonance in the frequency f2 is eliminated.

Figure 3:
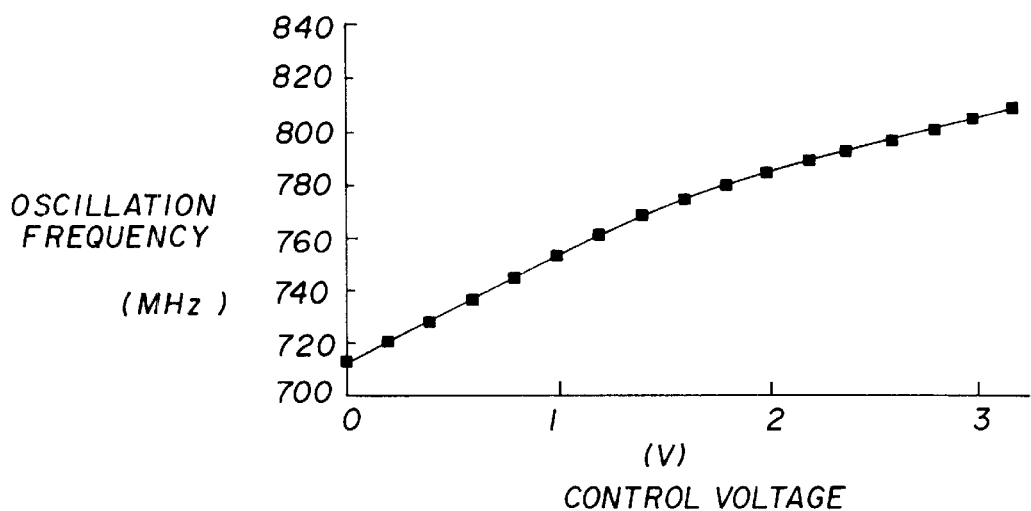
FIG. 3 is the diagram showing the relationship between an oscillation frequency and a control voltage in the voltage controlled. oscillation circuit of FIG. 1.

In FIG. 3, the relationship between the oscillation frequency and the control voltage is indicated when the fourth capacitor C4 of the loop filter 6 is connected to the control voltage terminal 5 of the voltage controlled oscillation circuit 10 of the present invention. As is clear from FIG. 2, due to the elimination of the sub-resonance, the abnormal oscillation does not occur by the value of a control voltage, and the relationship of the oscillation frequency and the control voltage becomes almost linear. Moreover, the influence of the sub-resonance is eliminated, and the changes of the oscillation frequency toward the changes of the control voltage also becomes large, and the relationship is improved.

Thus, by connecting the resistor R2 as a resistive element between the other end of the choke element L1 and the control voltage terminal 5, the sub-resonance can be eliminated, and the abnormal oscillation of the voltage controlled oscillation circuit 10 can be prevented. Thus, the relationship between the oscillation frequency and the control voltage is almost linear.

In addition, the resistive element is not limited to a chip resistor. As long as it works as a resistor in DC circuit, resistance such as a thick film screen printed resistance or a thin-film resistance may be employed.

Figure 4:
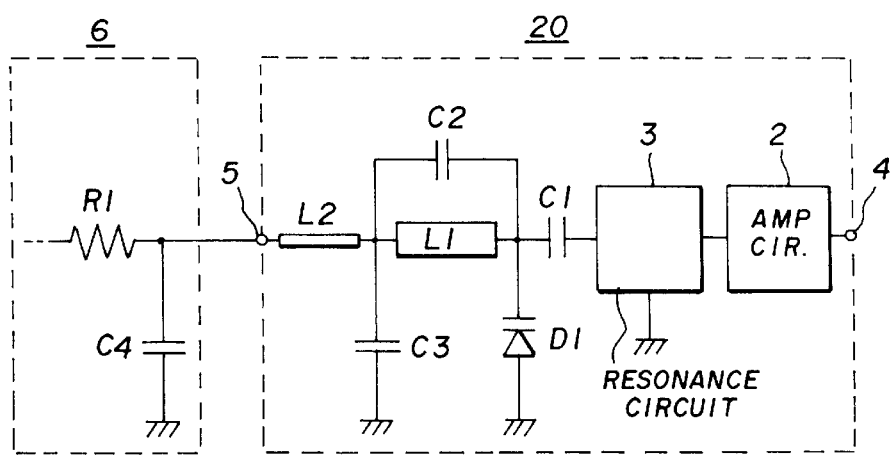
FIG. 4 is the circuit diagram showing another preferred embodiment of the voltage controlled oscillation circuit of the present invention.

Another preferred embodiment of the voltage controlled oscillation circuit of the present invention is shown in FIG. 4. In FIG. 4, the same symbol or reference numeral as FIG. 1 shows an identical or equivalent portion and the explanation corresponding to it is omitted.

The different point from FIG. 1 is that in FIG. 4 the voltage controlled oscillation circuit 20 is provided with a inductor L2 instead of the resistor R2. The inductor L2 is connected between the other end of the choke element L1 and the control voltage terminal 5. The inductor L2 comprises of the microstrip line having a narrow width and a predetermined length.

In this arrangement, the fourth capacitor C4 of the loop filter 6 is connected to the third capacitor C3 of the voltage controlled oscillation circuit 20 via at least the inductor L2. Therefore, in a high-frequency manner, it is regarded that the reactance value of the fourth capacitor C4 varies, and the frequency f3 of the sub-resonance shifts lower than the frequency f2 of the sub-resonance of the conventional voltage controlled oscillation circuit 1. As the inductance value of the inductor L2 becomes larger, the frequency f3 of the sub-resonance becomes lower. This can be considered the same as that the distance between the loop filter and the voltage controlled oscillation circuit is large, and the inductance component of the wiring between the output of the loop filter and the control voltage terminal of the voltage controlled oscillation circuit is large. Thus, even if the sub-resonance occurs, an adverse influence on a voltage controlled oscillation circuit is hardly imposed.

Figure 5:
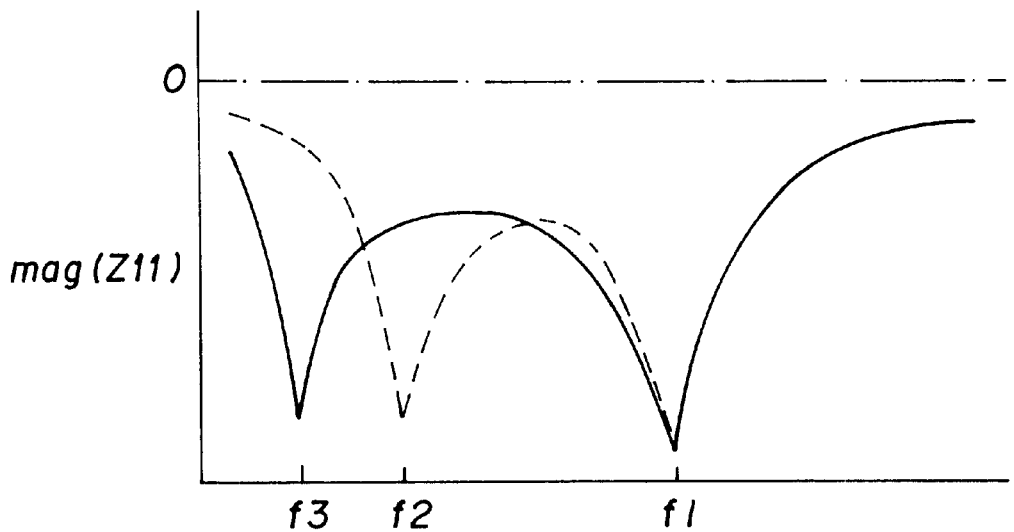
FIG. 5 is the diagram showing the impedance as which the resonance circuit side is viewed from the node of the amplifier circuit and a resonance circuit of the voltage controlled oscillation circuit of FIG. 4.

In FIG. 5, the impedance (mag (Z11)) of the resonance circuit 3 side is shown. The resonance circuit 3 side is viewed from the node of the resonance circuit 3 and the amplifier circuit 2 of the voltage controlled oscillation circuit 1 when the inductor L2 is connected between the other end of the choke element L1 and the control voltage terminal 5. The broken line shows the characteristic of the conventional voltage controlled oscillation circuit 1, and the solid line shows the characteristic of the voltage controlled oscillation circuit 20 of this invention. In the voltage controlled oscillation circuit 20 of the present invention, the sub-resonance point shifts from the frequency f2 to the frequency f3, and is separated from the original oscillation frequency f1.

Thus, since the inductor L2 as an inductance element is connected between the other end of the choke element L1 and the control voltage terminal 5, the frequency of the sub-resonance can be separated from the origin oscillation frequency. As a result, the abnormal oscillation of the voltage controlled oscillation circuit can be prevented and the relationship between he oscillation frequency and the control voltage exhibits almost linear.

In addition, as an inductance element, it is not limited to a microstrip line. It may be provided with the electrode of the strip line of a triplate structure or a mere strip line electrode without a corresponding ground electron Moreover, as long as it works as an inductor, such a strip line or an electrode be substituted with a coil and a chip inductor.

According to the voltage controlled oscillation circuit of the present invention, since an inductance element or a resistive element is connected between the other end of the choke element whose one end is connected the cathode of the varactor diode and a control voltage terminal, the sub-resonance (the sub-resonance occurs due to the capacitor in the output side of the loop filter connected to the control voltage terminal) of the resonance system of the voltage controlled oscillation circuit can be eliminated. Alternatively, the frequency of the sub-resonance can be shifted away from the original oscillation frequency. This can prevent the abnormal oscillation of the voltage controlled oscillation circuit, and the relationship between the oscillation frequency and the control voltage exhibits almost linear.

The present invention has been described by way of exemplary embodiments to which it is not limited. Variations and modifications to the invention will occur to skilled artisans without department from the invention as described in the appended claims.

What is claimed is:

1. A voltage controlled oscillation circuit connected to a first capacitor, the voltage controlled oscillation circuit:
    an amplifier circuit;
    a resonance circuit connected to said amplifier circuit;
    a varactor diode connected to said resonance circuit, an anode of said varactor diode being grounded;
    a choke element having one end thereof connected to a cathode of said varactor diode, said choke element having an inductance element and a second capacitor connected to said inductance element in parallel wherein a parallel resonance occurs in a vicinity of an oscillation frequency;
    a third capacitor connected between an other end of said choke element and a ground; and
    an impedance element with a first end connected to the other end of said choke element, a second end of said impedance element being connected to a control voltage terminal;
    wherein one end of said first capacitor is connected to the second end of said impedance element and to said control voltage terminal, and an other end of said first capacitor is connected to ground.

2. A voltage controlled oscillation circuit in accordance with claim 1, wherein said impedance element is a resistance element.

3. A voltage controlled oscillation circuit in accordance with claim 1, wherein said impedance element is an inductance element.

4. A voltage controlled oscillation circuit in accordance with claim 3, wherein said inductance element is a strip of a triplate structure.

5. A voltage controlled oscillation circuit in accordance with claim 3, wherein said inductance element is a coil.

6. A voltage controlled oscillation circuit in accordance with claim 3, wherein said inductance element is a chip inductor.

* * * * *